(12) United States Patent
Yang et al.

(10) Patent No.: US 9,235,242 B2
(45) Date of Patent: Jan. 12, 2016

(54) HEAT DISSIPATING MODULE HAVING ENHANCED HEAT DISSIPATING EFFICIENCY

(75) Inventors: Wen-Hsiung Yang, New Taipei (TW); Shih-Huai Cho, New Taipei (TW); Hua Chen, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 678 days.

(21) Appl. No.: 13/590,136

(22) Filed: Aug. 20, 2012

(65) Prior Publication Data

US 2013/0250517 A1   Sep. 26, 2013

(30) Foreign Application Priority Data

Mar. 22, 2012   (TW) .............................. 101205168 U

(51) Int. Cl.
*H05K 7/20* (2006.01)
*G06F 1/20* (2006.01)

(52) U.S. Cl.
CPC .............. *G06F 1/20* (2013.01); *H05K 7/20727* (2013.01); *H05K 7/20145* (2013.01); *H05K 7/20154* (2013.01); *H05K 7/20181* (2013.01)

(58) Field of Classification Search
CPC .......... H05K 7/20145; H05K 7/20154; H05K 7/20181; H05K 7/20727
USPC .................. 361/679.46–679.51, 710, 697
See application file for complete search history.

(56) References Cited

U.S. PATENT DOCUMENTS

| 7,573,712 B2* | 8/2009 | Wu et al. ........................ 361/695 |
| 2006/0181846 A1* | 8/2006 | Farnsworth et al. .......... 361/695 |
| 2007/0023166 A1 | 2/2007 | Hung |
| 2008/0101018 A1* | 5/2008 | Long et al. ..................... 361/695 |
| 2009/0316358 A1* | 12/2009 | Zheng et al. ................... 361/697 |
| 2010/0097754 A1* | 4/2010 | Li et al. ..................... 361/679.49 |
| 2011/0085298 A1* | 4/2011 | Xiao et al. ..................... 361/692 |
| 2011/0171899 A1* | 7/2011 | Ye et al. ......................... 454/284 |
| 2011/0290455 A1* | 12/2011 | Tang et al. ..................... 165/121 |
| 2012/0026680 A1* | 2/2012 | Ke et al. ..................... 361/679.49 |
| 2012/0188713 A1* | 7/2012 | Chen ............................. 361/688 |

* cited by examiner

*Primary Examiner* — Anatoly Vortman
*Assistant Examiner* — Jacob Crum
(74) *Attorney, Agent, or Firm* — Winston Hsu; Scott Margo

(57) ABSTRACT

A heat dissipating module having enhanced heat dissipating efficiency is disclosed. The heat dissipating module includes a heat dissipating member, a base and an air guiding member. The heat dissipating member is installed on a first electronic component for dissipating heat generated by the first electronic component. The base is installed on a side of the heat dissipating member, and the air guiding member is connected to the base. The air guiding member and the base cooperatively guide an air flow passing through the heat dissipating member to a second electronic component located on a side of the first electronic component.

5 Claims, 7 Drawing Sheets

US 9,235,242 B2

HEAT DISSIPATING MODULE HAVING ENHANCED HEAT DISSIPATING EFFICIENCY

BACKGROUND OF THE DISCLOSURE

1. Field of the Disclosure

The present disclosure relates to a heat dissipating module, and more particularly, to a heat dissipating module having enhanced heat dissipating efficiency.

2. Description of the Prior Art

An electronic device is equipped with a fan in general for generating an air flow therein, so as to dissipate heat generated by internal electronic components of the electronic device. Accordingly, the internal electronic components can function normally with an adequate temperature. Since there is a trend for the electronic device to have designs of light weight, thin thickness, short and small size, the certain internal electronic component, such as an automatic voltage regulator, is often located on a lee side of another electronic component relative to the fan. In other words, the certain internal electronic component is often disposed in a position where the air flow is hard to achieve. As a result, the heat generated by the certain internal electronic component can not be dissipated in time, so as to reduce heat dissipating efficiency and to further result in abnormal functioning.

An additional thermal fin is disposed on the certain electronic component located on the lee side of the other electronic component relative to the fan for increasing heat dissipating area thereof, so as to enhance the heat dissipating efficiency of the certain electronic component. Since the thermal fin dissipates heat by heat conducting surface, the aforesaid thermal fin needs to have a specific volume for maintaining heat dissipating efficiency.

However, there is not enough space to contain the aforesaid thermal fin due to the trend of the electronic device for designs of light weight, thin thickness, short and small size. In other words, the constrained internal space of the electronic device constrains the volume of the thermal fin. Accordingly, it reduces the heat dissipating efficiency. In addition, the thermal fin results in an additional expense of materials, so as to increase manufacture cost and to further disadvantage the product in the market.

SUMMARY OF THE DISCLOSURE

Thus, the present disclosure provides a heat dissipating module having enhanced heat dissipating efficiency and reduced manufacture cost for solving above drawbacks.

The present disclosure discloses a heat dissipating module. The heat dissipating module includes a heat dissipating member, a base and an air guiding member. The heat dissipating member is installed on a first electronic component for dissipating heat generated by the first electronic component. The base is installed on a side of the heat dissipating member, and the air guiding member is connected to the base. The air guiding member and the base cooperatively guide an air flow passing through the heat dissipating member to a second electronic component located on a side of the first electronic component.

These and other objectives of the present disclosure will no doubt become obvious to those of ordinary skill in the art after reading the following detailed description of the embodiment that is illustrated in the various figures and drawings.

DETAILED DESCRIPTION

Figure 1:
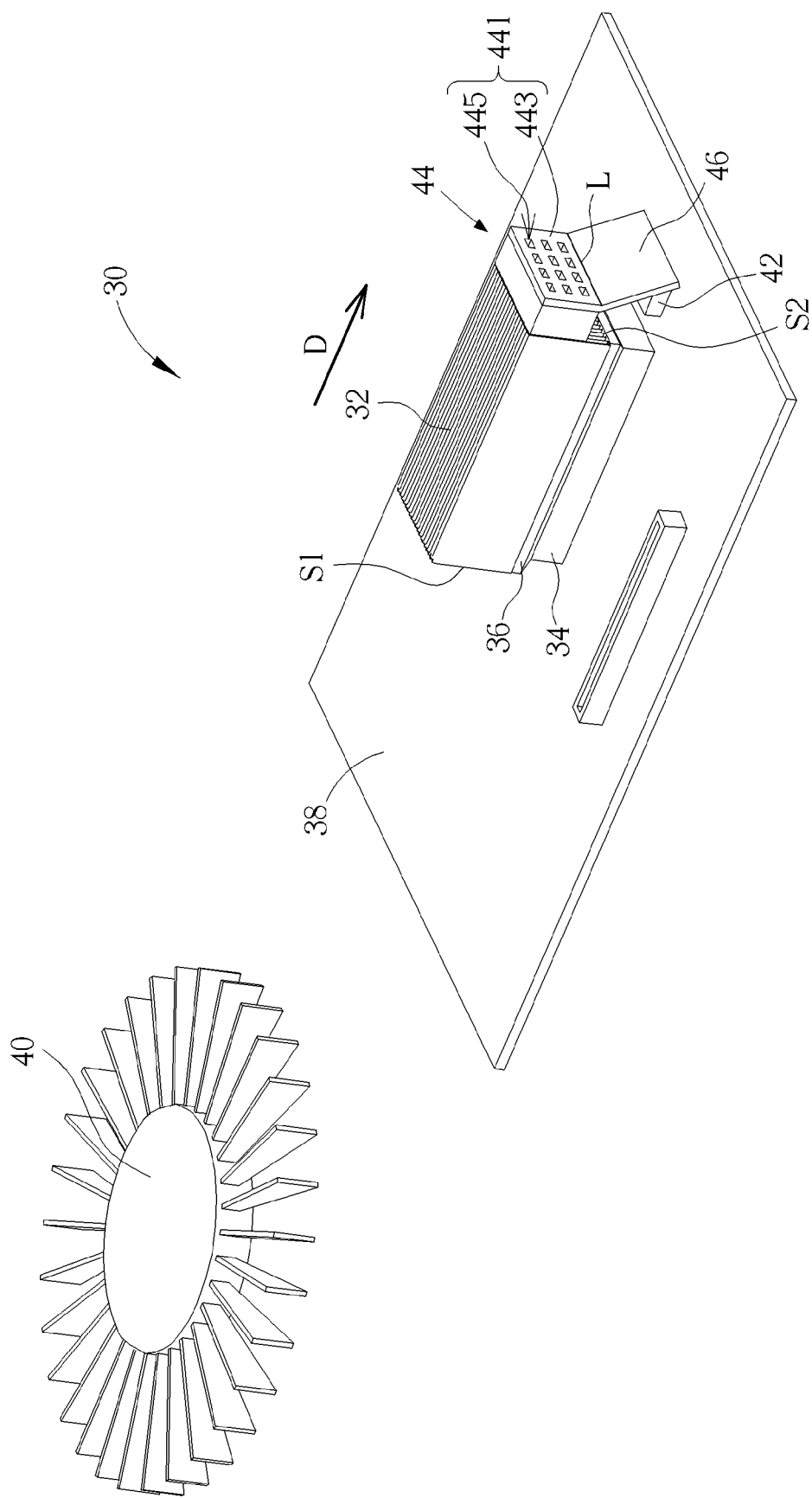
FIG. 1 is a diagram of a heat dissipating module according to a first embodiment of the present disclosure.
Figure 2:
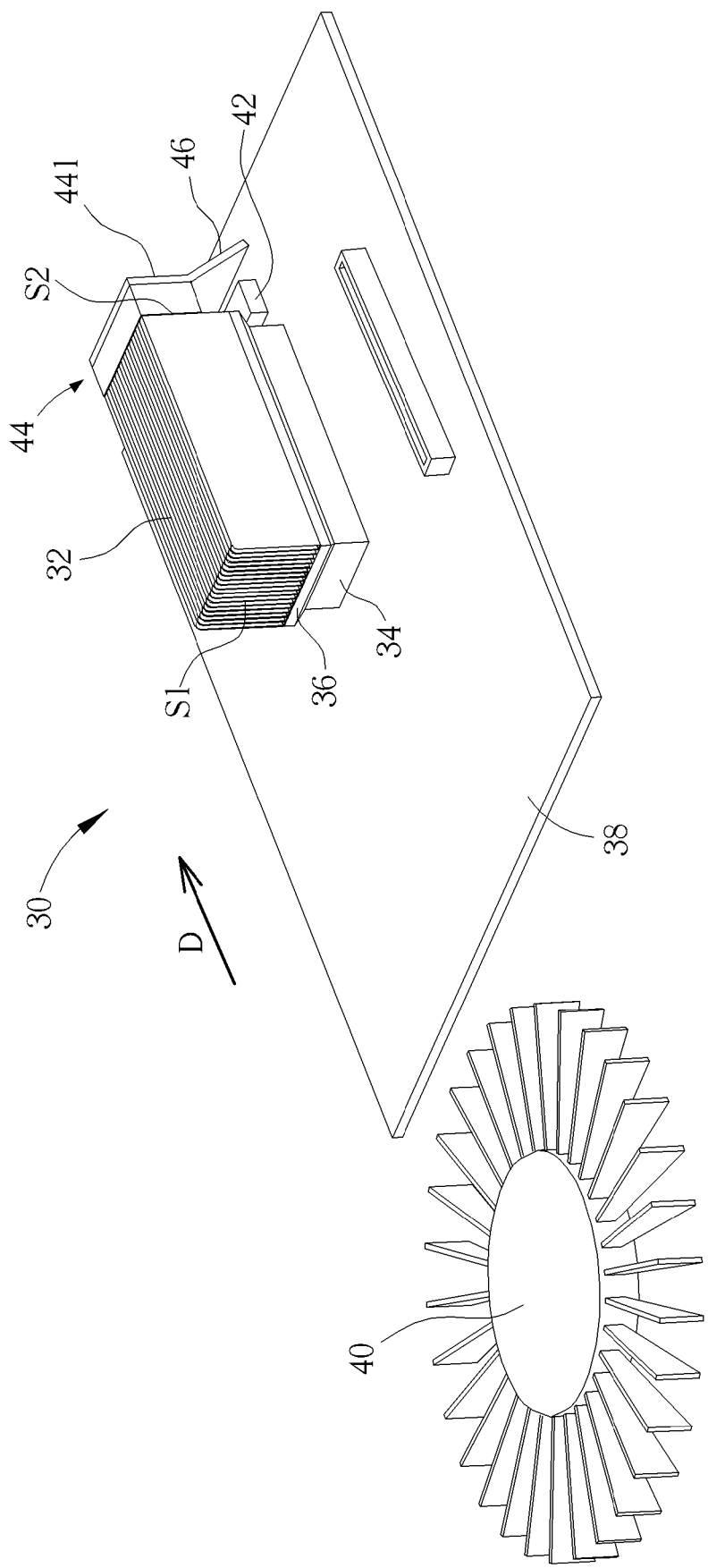
FIG. 2 is diagram of the heat dissipating module in another view according to the first embodiment of the present disclosure.

Please refer to FIG. 1 and FIG. 2. FIG. 1 is a diagram of a heat dissipating module 30 according to a first embodiment of the present disclosure. FIG. 2 is diagram of the heat dissipating module 30 in another view according to the first embodiment of the present disclosure. As shown in FIG. 1 and FIG. 2, the heat dissipating module 30 includes a heat dissipating member 32 which can be a thermal fin. The heat dissipating member 32 is disposed on a first electronic component 34. The heat dissipating member 32 is used for dissipating heat generated by the first electronic component 34, such that the first electronic component 34 can function normally with an adequate temperature. Furthermore, the heat dissipating module 30 further includes a fixing plate 36 for fixing the heat dissipating member 32 on the first electronic component 34. In practical application, the fixing plate 36 can be covered with thermal grease for strengthening the heat generated by the running first electronic component 34 to be conducted to the heat dissipating member 32, so as to enhance the heat dissipating efficiency of the heat dissipating module 30.

In addition, the heat dissipating member 32 and the first electronic component 34 are installed on a circuit board 38. In this embodiment, the first electronic component 34 can be a Central Processing Unit, CPU, of an electronic device, the heat dissipating member 32 can be used for dissipating the heat generated by the aforesaid Central Processing Unit, and the circuit board 38 can be a main board. In practical application, the heat dissipating module 30 of the present disclosure can be adapted to the electronic device with the Central Processing Unit, such as a computer device, a server computer and so on. Furthermore, the electronic device can include a fan 40 for generating an air flow inside the electronic device, so as to facilitate the heat dissipating member 32 to dissipate the heat generated by the running first electronic component 34 on the circuit board 38 by convection.

In this embodiment, the fan 40 is located on a first side S1 corresponding to the heat dissipating member 32. When the fan 40 activates, the fan 40 can generate the air flow inside the electronic device. In the meanwhile, the air flow will pass through the heat dissipating module 30 in a flow direction D, as shown in FIG. 1 and FIG. 2. In other words, the air flow passes through the heat dissipating module 30 from the first side S1 of the heat dissipating member 32 to a second side S2 of the heat dissipating member 32 opposite to the first side S1.

Figure 3:
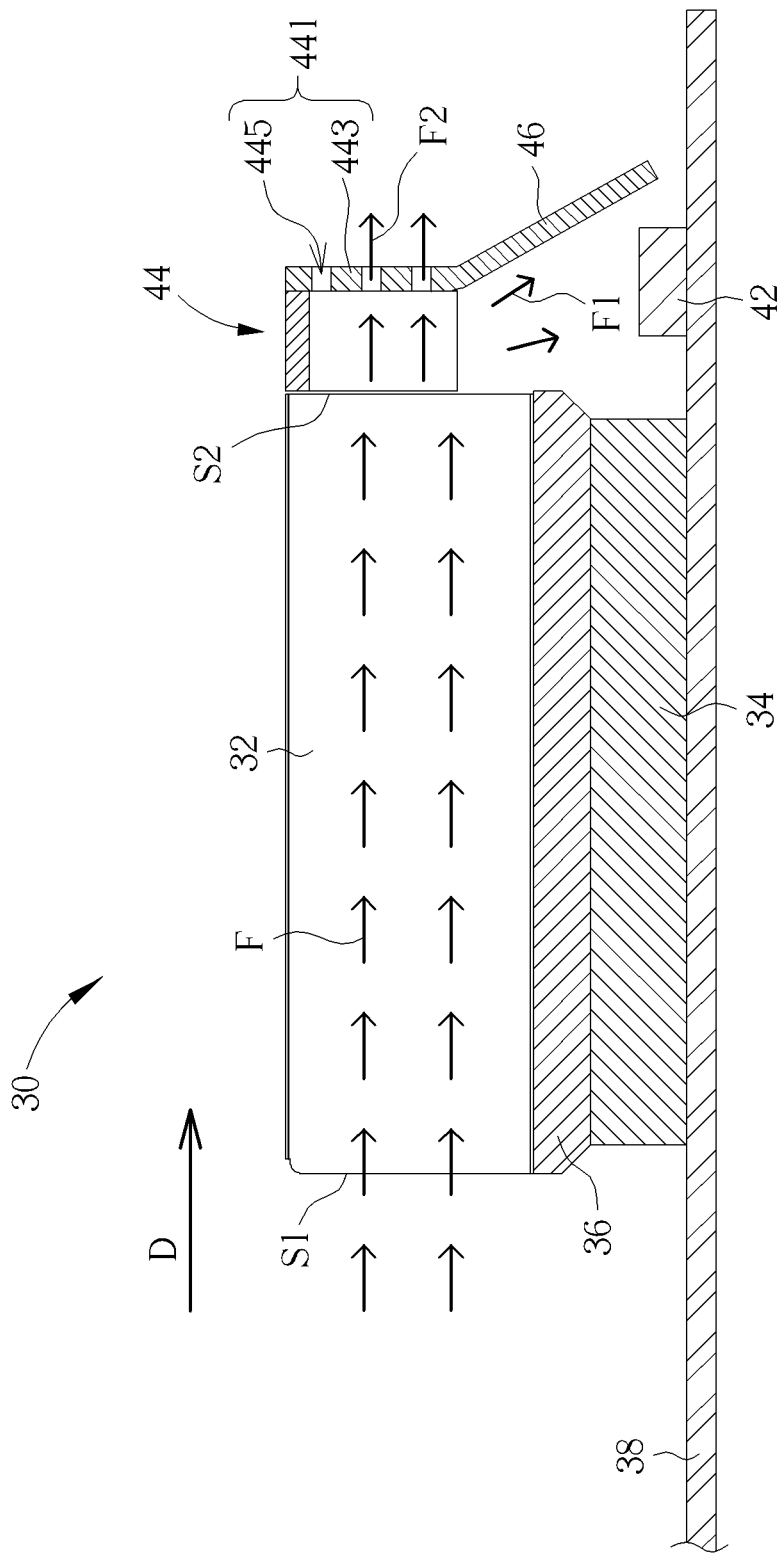
FIG. 3 is a sectional diagram of the heat dissipating module according to the first embodiment of the present disclosure.

Please refer to FIG. 3. FIG. 3 is a sectional diagram of the heat dissipating module 30 according to the first embodiment of the present disclosure. As shown in FIG. 3, a second electronic component 42 is located on a side of the first electronic component 34, and the second electronic component 42 can be an automatic voltage regulator. When the fan 40 activates, an air flow F passes through the heat dissipating module 30 in the flow direction D. The air flow F can not directly achieve the second electronic component 42 due to obstruction of the first electronic component 34. In other words, the second electronic component 42 is located on a lee side of the first electronic component 34 relative to the fan 40.

As shown in FIG. 1 to FIG. 3, the heat dissipating module 30 further includes a base 44 and an air guiding member 46. The base 44 is installed on the second side S2 of the heat dissipating member 32, i.e. on the lee side of the heat dissipating member 32, and the air guiding member 46 is connected to the base 44. In this embodiment, the air guiding member 46 and the base 44 can be, but not limited to, integrally formed. For example, the air guiding member 46 and the base 44 can be two separate components. As for which one of the aforesaid designs is adopted, it depends on practical demands. In practical application, the base 44 can be, but not limited to, installed on the heat dissipating member 32 in a hooking manner. For example, the base 44 can be installed on the heat dissipating member 32 in a screwing or in a glued manner as well. As for which one of the aforesaid designs is adopted, it depends on practical demands.

In addition, the base 44 includes an air adjustment member 441 connected to the air guiding member 46. As shown in FIG. 3, the air adjustment member 441 includes a main body 443 and an aperture portion 445. The main body 443 is connected to the base 44 and the air guiding member 46, and the aperture portion 445 is formed on the main body 443. When the fan 40 activates, since the air flow F generated by the fan 40 flows in the flow direction D, the air flow F will pass through the heat dissipating member 32 from the first side S1 of the heat dissipating member 32 to the second side S2 of the heat dissipating member 32, i.e. in the flow direction D.

In order to avoid the issue that the air flow F can not directly achieve the second electronic component 42 to dissipate the heat generated by the running second electronic component 42, so as to result in abnormal functioning of the second electronic component 42 due to an inadequate temperature, the main body 443 of the air adjustment member 441 of the base 44 is used for obstructing a part F1 of the air flow F passing through the heat dissipating member 32 when the air flow F achieves the base 44 installed on the second side S2 of the heat dissipating member 32. In the meanwhile, the part F1 diverges from the air flow F due to obstruction of the main body 443 of the air adjustment member 441. In other words, the part F1 of the air flow F no longer flows in the flow direction D and is guided by the base 44 and the air guiding member 46 to the second electronic component 42 located on the side of the first electronic component 34, so as to dissipate the heat generated by the running second electronic component 42, such that the second electronic component 42 is capable of functioning normally with the adequate temperature.

It should be noticed that an angle is includes between the air guiding member 46 and the base 44, such that the part F1 of the air flow F can be precisely guided to the second electronic component 42 on the lee side of the first electronic component 34 by the air guiding member 46, so as to enhance the heat dissipating efficiency of the heat dissipating module 30. In addition, since there is the angle included between the air guiding member 46 and the base 44, a bending line L is formed at a joint between the air guiding member 46 and the main body 443 of the air adjustment member 441 of the base 44, as shown in FIG. 1. The air guiding member 46 can be designed to be fixed relative to the base 44. That is, the angle between the air guiding member 46 and the base 44 is not adjustable. Designs for the air guiding member 46 and the base 44 are not limited to those mentioned above. In other words, the air guiding member 46 can be designed to be adjustable relative to the main body 443 of the air adjustment member 441 as well. In other words, the angle between the air guiding member 46 and the base 44 is adjustable, so as to guide the part F1 of the air flow F to the second electronic component 42 located on the lee side of the first electronic component 34. Accordingly, the heat dissipating efficiency of the heat dissipating module 30 can be enhanced. As for which one of the aforesaid designs is adopted, it depends on practical demands.

On the other hand, when the air flow F achieves the base 44 installed on the second side S2 of the heat dissipating member 32, the aperture portion 445 of the air adjustment member 441 of the base 44 is used for allowing another part F2 of the air flow F passing through the heat dissipating member 32 to flow through. In the meanwhile, the other part F2 of the air flow F continues to flow in the flow direction D and then leaves the heat dissipating module 30, as shown in FIG. 3. In other words, when the air flow F achieves the base 44, the heat dissipating module 30 of the present disclosure not only utilizes the main body 443 of the air adjustment member 441 to force the part F1 of the air flow F to diverge, but also utilizes the aperture portion 445 of the air adjustment member 441 to allow the other part F2 of the air flow F to continue to flow in the flow direction and further to leave the heat dissipating module 30.

A flow rate of the air flow F passing through the heat dissipating member 32 is a sum of a flow rate of the part F1 of the air flow F guided to the second electronic component 42 and a flow rate of the other part F2 of the air flow F flowing through the aperture portion 445. Accordingly, the air adjustment member 441 can be used for adjusting the flow rate of the part F1 of the air flow F guided to the second electronic component 42 located on the lee side of the first electronic component 34. For example, the larger an aperture rate of the aperture portion 445 is, the more part F2 of the air flow F passes through the aperture portion 445 while the less part F1 of the air flow F is guided to the second electronic component 42. The smaller the aperture rate of the aperture portion 445 is, the less part F2 of the air flow F passes through the aperture portion 445 while the larger part F1 of the air flow F is guided to the second electronic component 42. Accordingly, the flow rate inside the electronic device can be adjusted, so as to enhance flexibility of the heat dissipating module 30 and to further meet various requirements of different electronic devices.

Figure 4:
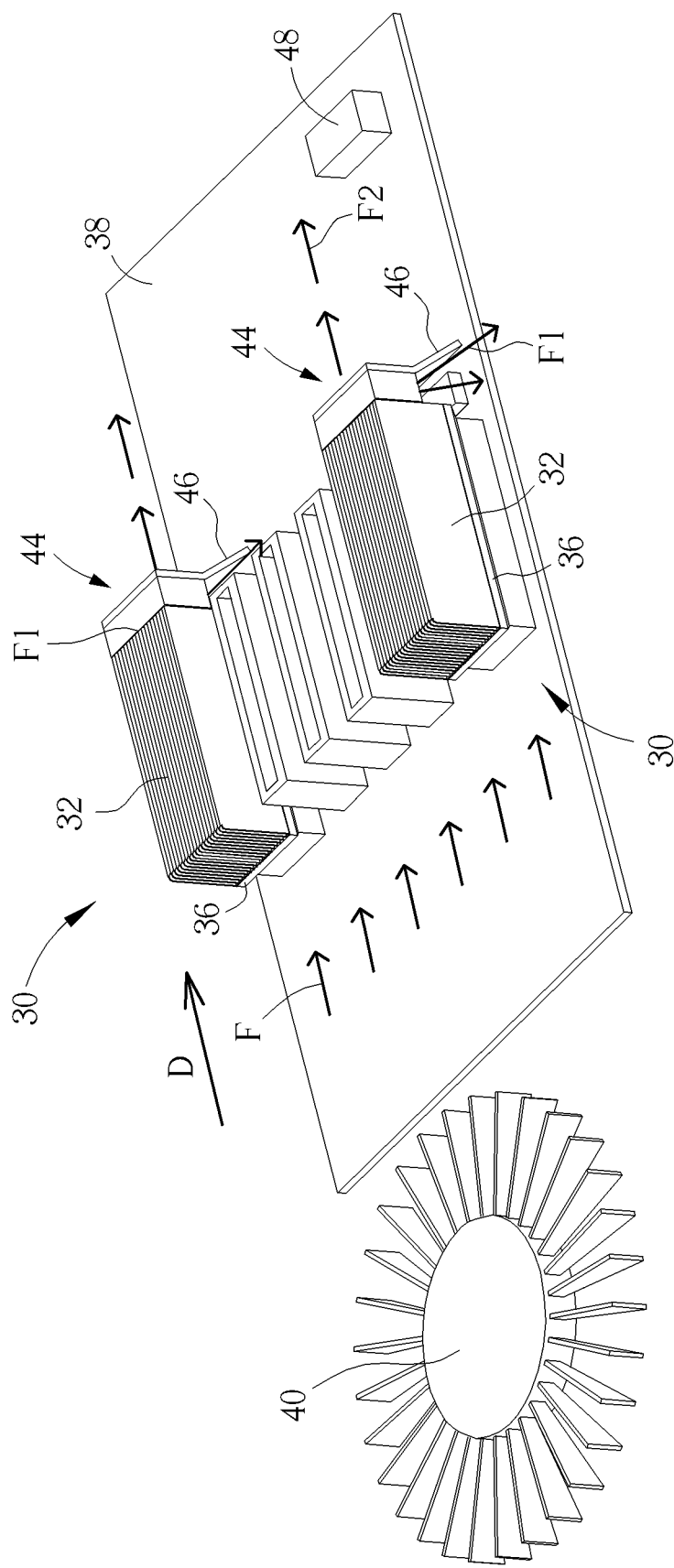
FIG. 4 is a diagram of the heat dissipating module applied in another environment according to the first embodiment of the present disclosure.

For example, please refer to FIG. 4. FIG. 4 is a diagram of the heat dissipating module 30 applied in another environment according to the first embodiment of the present disclosure. As shown in FIG. 4, a third electronic device 48 is on the circuit board 38 and located on another side opposite to the fan 40, and the heat dissipating module 30 and other electronic components are disposed between the fan 40 and the third electronic component 48. In order to avoid the air flow F generated by the fan 40 from directly achieving the third electronic component 48 due to obstruction of the heat dissipating module 30 and other electronic components, the aperture portion 445 of the air adjustment member 441 of the base 44 allows the other part F2 of the air flow F to flow through, such that the other part F2 of the air flow F can achieve the third electronic component 48. Accordingly, it can dissipate the heat generated by the running third electronic device 48, such that the third electronic component 48 can function with the adequate temperature.

In this embodiment, the aperture portion 445 of the air adjustment member 441 can include a plurality of apertures, and the apertures are respectively a square structure. In practical application, the air adjustment member 441 can adjust the flow rate of the other part F2 of the air flow F by an amount of aperture. An amount and shapes of the apertures are not limited to those mentioned in this embodiment, and it depends on practical demands.

Figure 5:
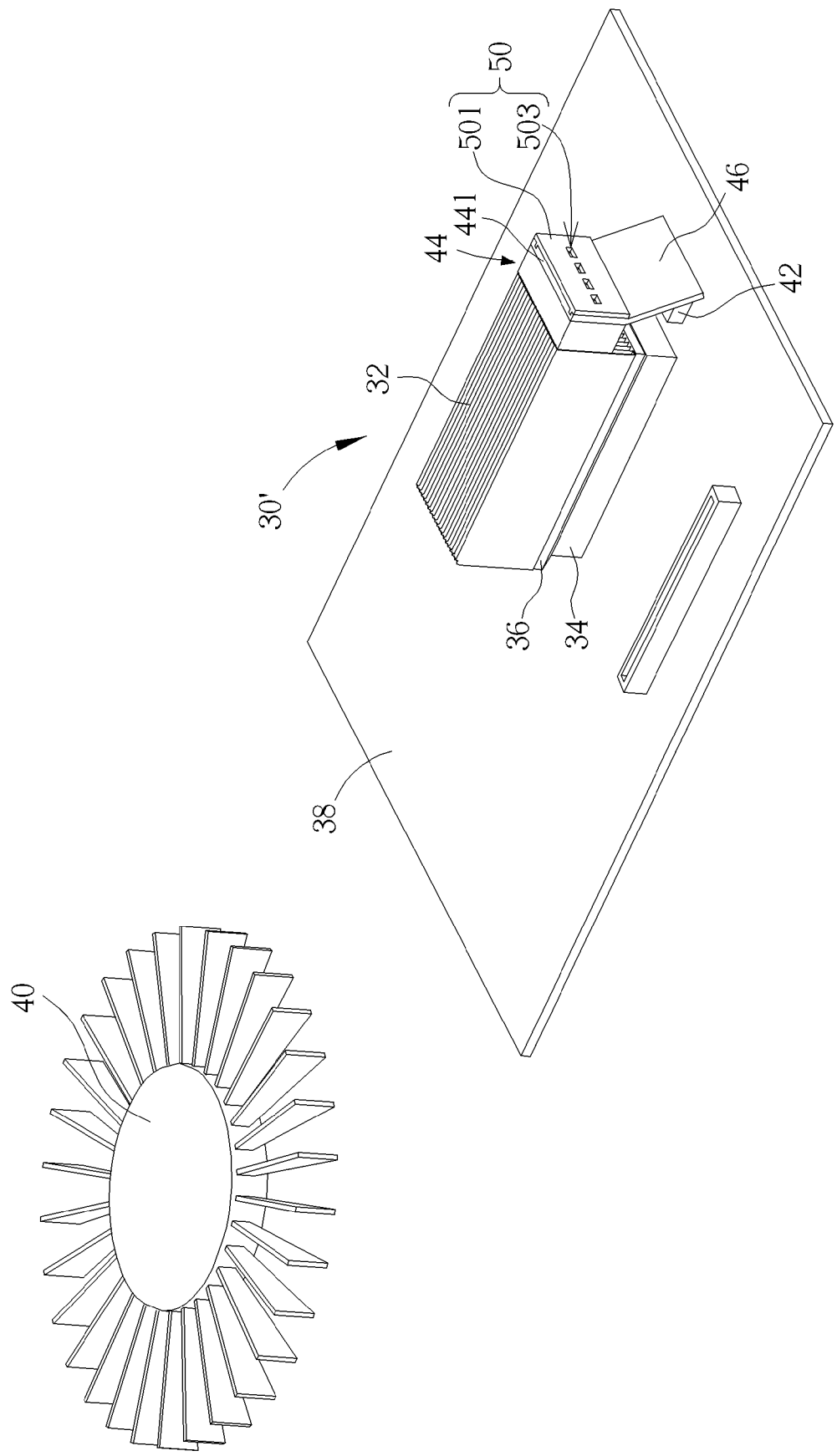
FIG. 5 is a diagram of a heat dissipating module according to a second embodiment of the present disclosure.
Figure 6:
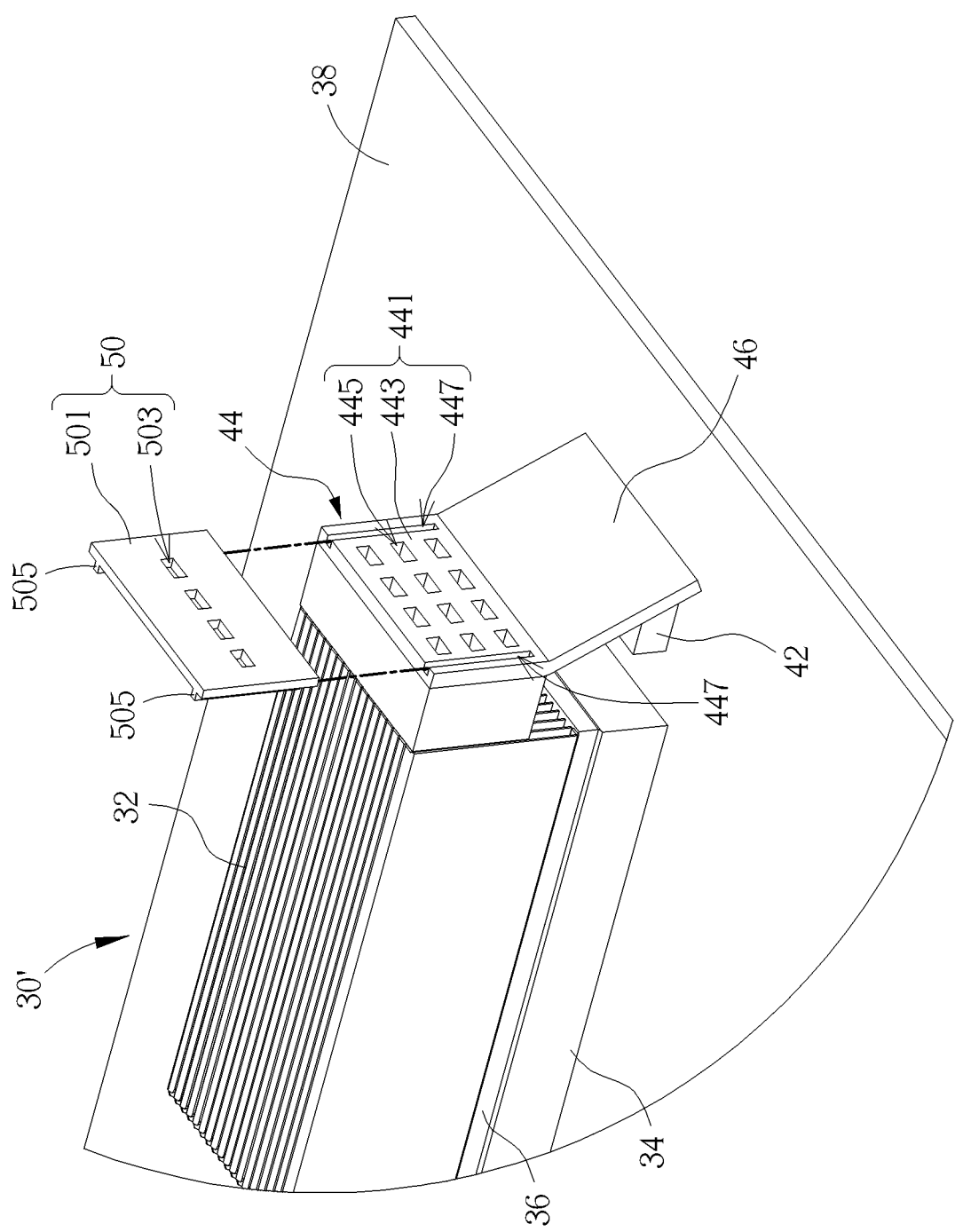
FIG. 6 is an exploded diagram of the heat dissipating module according to the second embodiment of the present disclosure.
Figure 7:
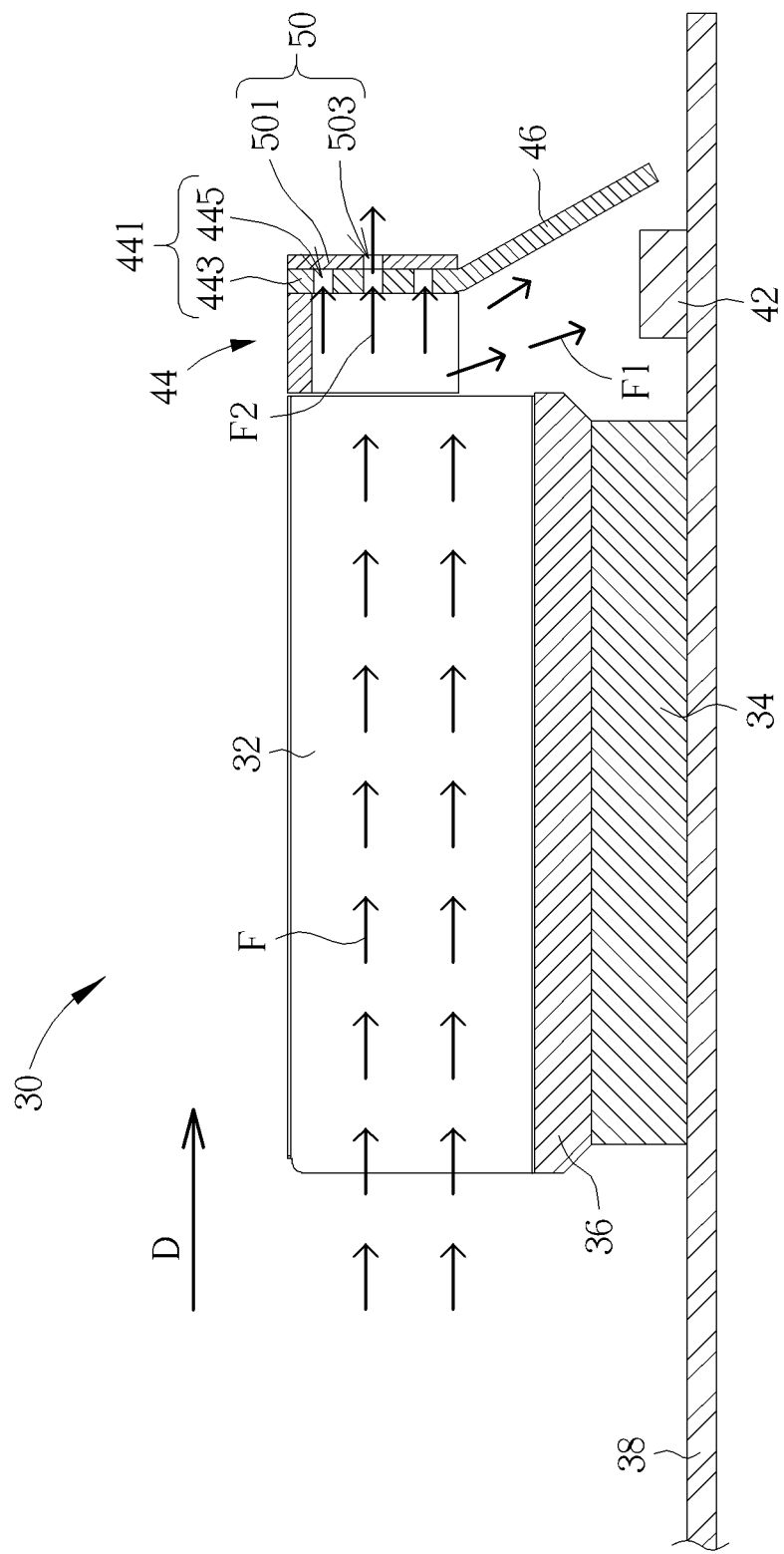
FIG. 7 is a sectional diagram of the heat dissipating module according to the second embodiment of the present disclosure.

Please refer to FIG. 5 to FIG. 7. FIG. 5 is a diagram of a heat dissipating module 30' according to a second embodiment of the present disclosure. FIG. 6 is an exploded diagram of the heat dissipating module 30' according to the second embodiment of the present disclosure. FIG. 7 is a sectional diagram of the heat dissipating module 30' according to the second embodiment of the present disclosure. As shown in FIG. 5 to FIG. 7, the major difference between the heat dissipating module 30' and the aforesaid heat dissipating module 30 is that the heat dissipating module 30' further includes a covering member 50 for covering at least one part of the aperture portion 445 of the air adjustment member 441, so as to adjust the flow rate of the part F1 of the air flow F guided to the second electronic component 42.

Furthermore, the covering member 50 of the heat dissipating module 30' includes a covering body 501 and a hole portion 503. The hole portion 503 is formed on the covering body 501. In this embodiment, the hole portion 503 can include a plurality of holes. In addition, the covering body 501 is disposed on the main body 443 of the air adjustment member 441 in a slidable manner. In this embodiment, the covering body 501 can include two sliding ribs 505, and two sliding slots 447 can be formed on the main body 443 of the air adjustment member 441 for cooperating with the sliding ribs 505. The covering body 501 can slide relative to the main body 443 of the air adjustment member 441 by the sliding ribs 505 and the sliding slots 447.

When the covering body 501 slides to a covering position relative to the main body 443, as shown in FIG. 5 and FIG. 7, the covering body 501 covers a part of the plurality of apertures and the plurality of holes align with another part of the plurality of apertures on the air adjustment member 441. In the meanwhile, the part F2 of the air flow F flowing through the aperture portion 445 of the air adjustment member 441 is blocked by the covering body 501 and incapable of leaving the heat dissipating module 30'. In such a manner, the covering member 50 of the heat dissipating module 30' can further adjust the part F1 of the air flow F guided to the second electronic component 42, so as to enhance the heat dissipating efficiency of the heat dissipating module 30'. The components in this embodiment with denotes identical to those in the aforesaid embodiment have the same structures and functions, and further descriptions are omitted herein for simplicity.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A heat dissipating module comprising:
a heat dissipating member installed on a first electronic component for dissipating heat generated by the first electronic component, the heat dissipating member having a first side, a second side and a bottom side, the first side being opposite to the second side, the bottom side connecting the first side and the second side, wherein an air flow passes through the heat dissipating member along a flow direction from the first side to the second side;
a base installed on the second side of the heat dissipating member;
an air guiding member connected to the base, the air guiding member and the base cooperatively guiding an air flow passing through the heat dissipating member to a second electronic component located near the second side and below the bottom side of the heat dissipating member, wherein a height of the first electronic component is greater than a height of the second electronic component, a bending line is formed at a joint between the air guiding member and the base, such that the air guiding member is bendable relative to the base, so as to adjust a flow angle of the air flow guided to the second electronic component, the base comprises an air adjustment member connected to the air guiding member for adjusting a flow rate of the air flow guided to the second electronic component, and the air adjustment member comprises:
a main body connected to the base and the air guiding member for stopping a part of the air flow passing through the heat dissipating member, such that the part of the air flow passing through the heat dissipating member is guided along the air guiding member to the second electronic component; and
an aperture portion formed on the main body for allowing another part of the air flow passing through the heat dissipating member to flow through; and
a covering member for covering at least one part of the aperture portion, so as to adjust the flow rate of the air flow guided to the second electronic component, the covering member comprising:
a covering body disposed on the main body in a slidable manner for covering the at least one part of the aperture portion; and
a hole portion formed on the covering body for allowing the other part of the air flow flowing through the aperture portion.

2. The heat dissipating module of claim 1, wherein the aperture portion comprises a plurality of apertures, the hole portion comprises a plurality of holes, and the covering body covers a part of the plurality of apertures and the plurality of holes align with another part of the plurality of apertures when the covering body slides to a covering position relative to the main body.

3. A heat dissipating module comprising:
a heat dissipating member installed on a first electronic component for dissipating heat generated by the first electronic component, the heat dissipating member having a first side, a second side and a bottom side, the first side being opposite to the second side, the bottom side connecting the first side and the second side, wherein an air flow passes through the heat dissipating member along a flow direction from the first side to the second side;
a base installed on the second side of the heat dissipating member; an air guiding member connected to the base, the air guiding member and the base cooperatively guiding an air flow passing through the heat dissipating member to a second electronic component located near the second side and below the bottom side of the heat dissipating member, wherein a height of the first electronic component is greater than a height of the second electronic component, the base comprises an air adjustment member connected to the air guiding member for adjusting a flow rate of the air flow guided to the second electronic component, and the air adjustment member comprises:
- a main body connected to the base and the air guiding member for stopping a part of the air flow passing through the heat dissipating member, such that the part of the air flow passing through the heat dissipating member is guided along the air guiding member to the second electronic component; and
- an aperture portion formed on the main body for allowing another part of the air flow passing through the heat dissipating member to flow through; and a covering member for covering at least one part of the aperture portion, so as to adjust the flow rate of the air flow guided to the second electronic component, the covering member comprising:
- a covering body disposed on the main body in a slidable manner for covering the at least one part of the aperture portion; and
- a hole portion formed on the covering body for allowing the other part of the air flow flowing through the aperture portion.

4. The heat dissipating module of claim 3, wherein the aperture portion comprises a plurality of apertures, the hole portion comprises a plurality of holes, and the covering body covers a part of the plurality of apertures and the plurality of holes align with another part of the plurality of apertures when the covering body slides to a covering position relative to the main body.

5. The heat dissipating module of claim 1, wherein the air guiding member and the base are integrally formed.

* * * * *